(12) United States Patent
Huang et al.

(10) Patent No.: US 7,544,750 B2
(45) Date of Patent: Jun. 9, 2009

(54) TOP ANTIREFLECTIVE COATING COMPOSITION WITH LOW REFRACTIVE INDEX AT 193NM RADIATION WAVELENGTH

(75) Inventors: Wu-Song S. Huang, Poughkeepsie, NY (US); William H. Heath, Austin, TX (US); Kaushal S. Patel, Wappingers Falls, NY (US); Pushkara R. Varanasi, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 301 days.

(21) Appl. No.: 11/249,693

(22) Filed: Oct. 13, 2005

(65) Prior Publication Data

US 2007/0087285 A1    Apr. 19, 2007

(51) Int. Cl.
*G03F 7/09* (2006.01)
(52) U.S. Cl. ............... 526/242; 430/273.1; 438/952
(58) Field of Classification Search ........... None
See application file for complete search history.

(56) References Cited

U.S. PATENT DOCUMENTS

| 5,879,853 | A |   | 3/1999  | Azuma |
| 5,994,007 | A | * | 11/1999 | Sato et al. ............... 430/22 |
| 6,051,364 | A |   | 4/2000  | Knors et al. |
| 6,057,080 | A |   | 5/2000  | Brunsvold et al. |
| 6,114,085 | A | * | 9/2000  | Padmanaban et al. .... 430/270.1 |
| 6,251,562 | B1 |  | 6/2001  | Breyta et al. |
| 6,274,295 | B1 |  | 8/2001  | Dammel et al. |
| 6,309,789 | B1 |  | 10/2001 | Takano et al. |
| 6,503,689 | B2 |  | 1/2003  | Zampini et al. |
| 2005/0014094 | A1 |  | 1/2005 | Lee et al. |
| 2005/0026076 | A1 |  | 2/2005 | Lee |
| 2005/0266354 | A1 | * | 12/2005 | Li et al. ............... 430/322 |
| 2006/0134546 | A1 | * | 6/2006 | Huang et al. ............ 430/270.1 |
| 2006/0134547 | A1 | * | 6/2006 | Huang et al. ............ 430/270.1 |
| 2007/0009830 | A1 | * | 1/2007 | Huang et al. ............ 430/270.1 |
| 2008/0124524 | A1 | * | 5/2008 | Yoshimura et al. ....... 428/195.1 |

FOREIGN PATENT DOCUMENTS

JP    11124531 A2    5/1999

OTHER PUBLICATIONS

Takeshi Okino, et al. "Resists Using The Absorption Band Shift Method For ArF Excimer Laser Lithography"—Journal of Photopolymer Science and Technology, vol. 11, No. 3 (1998) pp. 489-492.

Yusuke Takano, et al. "Top Antireflective Coating Process for 193 nm Lithography" Jpn 1, Appl. Phys. vol. 41 (2002) pp. 4051-4054, Part1, No. 6B Jun. 2002.

Fenglian Bai, et al. "Alternating Copolymers of 2-Vinylnaphthalene and Methacrylic Acid in Aqueous Solution" Department of Chemistry and Center for Polymer Research, American Cemical Society (1987) pp. 384-411 from Photophysics of Polymers, ACS Symposium Series 358, American Chemical Society, Washington DC.

Y. Takano et al.: "Top Antireflective Coating Process for 193 NM Lithography" Japanese Journal of Applied Physics, vol. 41, 2002, pp. 4051-4054, XP001163390 Japan.

* cited by examiner

*Primary Examiner*—Cynthia Hamilton
(74) *Attorney, Agent, or Firm*—Steven Capella

(57) ABSTRACT

Compositions characterized by the presence of an aqueous base-soluble polymer having aromatic moieties and a refractive index value n of less than 1.5 with respect to a radiation wavelength of 193 nm have been found which are especially useful as top antireflective coatings in 193 nm dry lithographic processes. Polymers with an ethylenic backbone and having fluorine and sulfonic acid moieties have been found to be especially useful. The compositions enable top reflection control at 193 nm while providing ease of use by virtue of their solubility in aqueous alkaline developer solutions.

20 Claims, No Drawings

TOP ANTIREFLECTIVE COATING COMPOSITION WITH LOW REFRACTIVE INDEX AT 193NM RADIATION WAVELENGTH

BACKGROUND OF THE INVENTION

In the microelectronics industry as well as in other industries involving construction of microscopic structures (e.g. micromachines, magnetoresistive heads, etc.), there is a continued desire to reduce the size of structural features. In the microelectronics industry, the desire is to reduce the size of microelectronic devices and/or to provide greater amount of circuitry for a given chip size.

Effective lithographic techniques are essential to achieving reduction of feature sizes. Lithography impacts the manufacture of microscopic structures not only in terms of directly imaging patterns on the desired substrate, but also in terms of making masks typically used in such imaging. Typical lithographic processes involve formation of a patterned resist layer by patternwise exposing the radiation-sensitive resist to an imaging radiation. The image is subsequently developed by contacting the exposed resist layer with a material (typically an aqueous alkaline developer) to selectively remove portions of the resist layer to reveal the desired pattern. The pattern is subsequently transferred to an underlying material by etching the material in openings of the patterned resist layer. After the transfer is complete, the remaining resist layer is then removed.

For many lithographic imaging processes, the resolution of the resist image may be limited by anomalous effects associated with refractive index mismatch and undesired reflections of imaging radiation. To address these problems, antireflective coatings are often employed between the resist layer and the substrate (bottom antireflective coating or BARC) and/or between the resist and the atmosphere in the physical path along which the imaging radiation is transmitted (top antireflective coating or TARC). In the case of dry lithographic processes such as dry 193 nm lithography (not involving an immersion fluid in the radiation exposure step), the atmosphere would typically be air. In the case of immersion lithography, the atmosphere would typically be water.

The performance of an antireflective coating composition is largely dependent on its optical characteristics at the imaging radiation wavelength of interest. A general discussion regarding the generally desired optical characteristics of TARCs can be found in U.S. Pat. No. 6,274,295. Among the optical parameters of interest are the refractive index, the reflectance and the optical density of the TARC.

The antireflective coating composition must also have the desired physical and chemical performance characteristics in the context of its use in contact directly with or in close proximity to the resist layer and in the context of the overall lithographic process (irradiation, development, pattern transfer, etc.). Thus, the TARC should not excessively interfere with the overall lithographic process. It is highly desirable to have a TARC which can be removed during the image development step which typically involves dissolution of a portion of the resist in an aqueous alkaline developer solution.

The existing commercial TARC compositions do not possess the combination of optical properties and physical and chemical performance characteristics needed for high resolution 193 nm dry lithography. For example, some TARC compositions have a desired refractive index below 1.5, but are not soluble in aqueous alkaline developers, thus leading to extra complication and expense of a separate TARC removal step. Other TARC compositions have a desired refractive index, but adverse interaction with the resist leading to excessive film loss and loss of contrast in the resulting resist image or leading to formation of undesired T-top structures. Other TARC compositions have desired solubility in aqueous alkaline developer, but have too high a refractive index at 193 nm.

Thus, there is a need for TARC compositions suitable for use in dry 193 nm lithographic processes to enable high resolution lithography, especially in the context of imaging over topography on the underlying substrate.

SUMMARY OF THE INVENTION

The invention encompasses novel antireflective coating compositions which are useful as top antireflective coating compositions in dry 193 nm lithographic processes. These compositions provide outstanding optical, physical and chemical performance properties that enable top reflection control at 193 nm while providing ease of use by virtue of their solubility in aqueous alkaline developer solutions. The antireflective compositions are characterized by a refractive index n of about 1.5 or less with respect to 193 nm wavelength radiation and the presence of a polymer that contains aromatic moieties and that is soluble in aqueous alkaline developers typically used for developing photolithographic images. The invention also encompasses methods of using such lithographic structures to pattern underlying material layers on a substrate.

In one aspect, the invention encompasses a composition suitable for use as a top antireflective coating layer for 193 nm lithography, the composition comprising an aqueous base-soluble polymer having aromatic moieties and a refractive index value n of less than about 1.5 with respect to a radiation wavelength of 193 nm. The polymer preferably further includes moieties that promote the solubility of the composition in aqueous base solutions. The polymer preferably has an ethylenic backbone. The polymer preferably further includes fluorine-containing moieties. The polymer further preferably includes acidic sulfur moieties.

In another aspect, the invention encompasses method of forming a patterned material feature on a substrate, the method comprising:
  (a) providing a material surface on a substrate,
  (b) forming a radiation-sensitive resist layer over the material surface,
  (c) forming a top antireflective coating over the resist layer, the antireflective coating of the invention,
  (d) patternwise exposing the resist layer to radiation thereby creating a pattern of radiation-exposed regions in the resist layer,
  (e) selectively removing portions of the resist layer and antireflective coating to expose portions of the material surface, and
  (f) etching or ion implanting the exposed portions of the material, thereby forming the patterned material feature.

The imaging radiation is preferably 193 nm radiation and the lithographic process is preferably a dry lithographic process.

These and other aspects of the invention are discussed in further detail below.

DETAILED DESCRIPTION OF THE INVENTION

The invention encompasses novel antireflective coating compositions which are useful as top antireflective coating compositions in dry 193 nm lithographic processes. These compositions provide outstanding optical, physical and chemical performance properties that enable top reflection control at 193 nm while providing ease of use by virtue of their solubility in aqueous alkaline developer solutions. The antireflective compositions are characterized by a refractive index n of about 1.5 or less with respect to 193 nm wavelength radiation and the presence of a polymer that contains aromatic moieties and that is soluble in aqueous alkaline developers typically used for developing lithographic images.

The polymer of the TARC preferably has an ethylenic backbone. More preferably, the polymer contains vinyl, acrylate and/or methacrylate monomeric units. The backbone of the polymer is preferably free of unsaturated carbon bonds.

The aromatic moieties are preferably independently selected from the group consisting of substituted or unsubstituted aromatic moieties or combinations thereof. More preferably, aromatic moieties are selected from the group consisting of fused aromatic moieties, heterocyclic aromatic moieties and combinations thereof in substituted or unsubstituted form. In the substituted form, the aromatic moieties may contain attached cyclic structures. Some preferred aromatic moieties are naphthalene and thiophene. Examples for substituted naphthalene containing cyclic structures are acenaphthene (i.e., acenaphthyl group) and hexahydropyrene (i.e., hexahydropyrenyl group). The aromatic moieties are preferably present as pendant groups. The amount of aromatic moieties in the polymer are preferably sufficient to reduce the refractive index n to less than 1.5, more preferably less than about 1.4, and most preferably to an n value between 1.3 and 1.4. While top antireflective coatings are typically applied very thinly, it is still preferable to avoid excessive amounts of aromatic groups which cause too much absorption at 193 nm. The compositions of the invention preferably have an extinction coefficient k of about 0.05 to 0.25 with respect to a radiation wavelength of 193 nm. The polymer preferably contains about 10 to 80 mole % of monomeric units having aromatic moieties, more preferably about 20-70 mole %, most preferably about 25-65 mole %.

The polymer preferably further includes moieties that promote the solubility of the composition in aqueous base solutions. Preferred solubility-promoting moieties are selected from the group consisting of hydroxyl groups, sulfonamidyl groups, N-hydroxy dicarboxyimidyl groups, other dicarboxyimidyl groups, other amino groups and other imidyl groups. The solubility-promoting moieties are preferably included in some monomeric units which make up the TARC polymer. The solubility-promoting moieties may be directly linked to the aromatic moieties or may be attached to other portions of the polymer. The amount of solubility-promoting functionality needed may depend on the degree of hydrophobicity of the aromatic component and the amount of aromatic component used. In one example, the solubility-promoting functionality may be provided in the form of acrylate or methacrylate monomers having a carboxylic acid moiety.

The polymer preferably further includes fluorine-containing moieties. Preferred fluorine containing moieties are trifluoromethyl groups. Fluorine moieties may also be present as fluorine atom substitutions for one or more hydrogen atoms of the aromatic moieties. The fluorine moieties may also be pendant from the aromatic moieties or from other portions of the polymer. Examples of some suitable fluorine-containing monomeric units have one of the following structures.

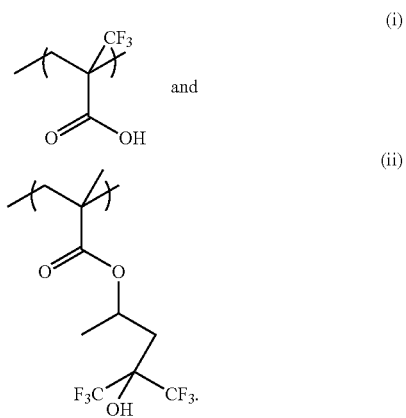

Structure (i), trifluoromethyl methacrylic acid, is a more preferred fluorine-containing monomeric unit. Other fluorine-containing structures may also be used. The amount of fluorine-containing monomeric unit is preferably about 10-90 mole %, more preferably about 20-70 mole %, most preferably about 30-60 mole %.

The polymer further preferably includes acidic moieties, more preferably acidic sulfur moieties, most preferably sulfonic acid moieties. The acidic moieties may be directly linked to the aromatic moieties or may be pendant from other portions of the polymer. Examples of monomeric units having sulfonic acid moieties are the following structures:

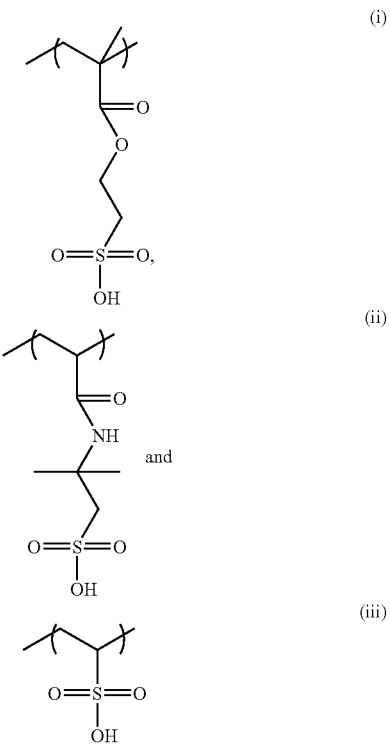

where structure (i) is more preferred. The amount of sulfur-containing monomeric units is preferably about 3 to 40 mole %, more preferably about 5-30 mole %.

Examples of some specific polymer embodiments are described below.

In a first embodiment, the polymer contains the following monomeric units:

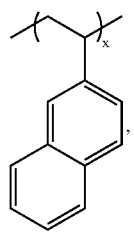

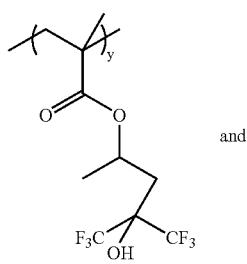

and

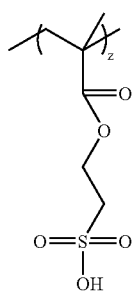

where x, y and z are greater than zero. Preferably, x is about 30-65, y is about 20-65 and z is about 5-30. Preferably, the polymer of this embodiment would consist essentially of these monomeric units.

In a second embodiment, the polymer contains the following monomeric units:

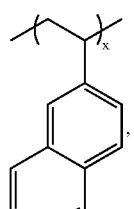

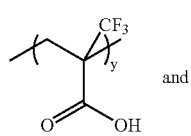

and

-continued

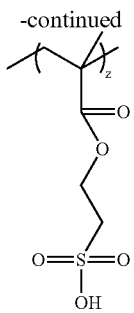

where x, y and z are greater than zero. Preferably, x is about 25-60, y is about 30-70 and z is about 5-25. Preferably, the polymer of this embodiment would consist essentially of these monomeric units. In general, the second embodiment is preferred over the first.

The polymers of the invention preferably have a weight average molecular weight of at least about 1000, more preferably a weight average molecular weight of about 1500-50000. The polymers of the invention may be made by conventional polymerization techniques using commercially available and/or easily synthesized monomers. If desired, blends of different polymers of the invention may be used or the composition may contain other polymer components. In general, however, the polymer component of the TARC compositions of the invention preferably consist essentially of the polymers of the invention.

The compositions of the invention may further comprise at least one solvent which is preferably immiscible with the underlying resist material. Suitable solvents include, but are not limited to: water, 1-butanol, methanol, ethanol, 1-propanol, ethylene glycol, 1,2-butanediol, 1,3-butanediol, 1,4-butanediol, 1,2-propanediol, 1-pentanol, 2-pentanol, 3-pentanol, 1-hexanol, 2-hexanol, 3-hexanol, 1-heptanol, 2-heptanol, 3-heptanol, 4-heptanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2,4-dimethyl-3-pentanol, 3-ethyl-2-pentanol, 1-methylcyclopentanol, 2-methyl-1-hexanol, 2-methyl-2-hexanol, 2-methyl-3-hexanol, 3-methyl-3-hexanol, 4-methyl-3-hexanol, 5-methyl-1-hexanol, 5-methyl-2-hexanol, 5-methyl-3-hexanol, 4-methylcyclohexanol, 1,3-propanediol, octanol, and decane. The amount of solvent in the composition for application to a substrate is preferably sufficient to achieve a solids content of about 0.5-5 wt. %. The compositions may include surfactants or other expedients known in the art.

The invention encompasses methods of forming a patterned material feature on a substrate, the method comprising:

(a) providing a material surface on a substrate, (b) forming a radiation-sensitive resist layer over the material surface, (c) forming a top antireflective coating over the resist layer, the antireflective coating of the invention, (d) patternwise exposing the resist layer to radiation thereby creating a pattern of radiation-exposed regions in the resist layer, (e) selectively removing portions of the resist layer and antireflective coating to expose portions of the material surface, and (f) etching or ion implanting the exposed portions of the material, thereby forming the patterned material feature.

The material layer of the semiconductor substrate may be a metal conductor layer, a ceramic insulator layer, a semiconductor layer or other material depending on the stage of the manufacture process and the desired material set for the end product. The compositions of the invention are especially useful for lithographic processes used in the manufacture of integrated circuits on semiconductor substrates. The compositions of the invention in lithographic processes to create patterned material layer structures such as metal wiring lines, holes for contacts or vias, insulation sections (e.g., damascene trenches or shallow trench isolation), trenches for capacitor structures, ion implanted Si structures for transistors, etc. as might be used in integrated circuit devices.

The TARC compositions of the invention preferably will substantially reduce the substrate reflectivity with respect to 193 nm radiation. If desired, a bottom antireflective coating may be applied to the substrate prior to formation of the resist layer. The resist is preferably imageable with 193 nm ultraviolet radiation. Examples of suitable resist materials are described in U.S. Published patent application Nos. 20050153232A1 and 20040063024A1 and U.S. Pat. Nos. 6,902,874, 6,730,452, 6,627,391, 6,635,401 and 6,756,180 the disclosures of which are incorporated herein by reference. Typically, the solvent-containing resist composition is applied using spin coating or other technique. The substrate with the resist coating is then preferably heated (pre-exposure baked) to remove the solvent and improve the coherence of the resist layer. The pre-exposure bake step is preferably conducted for about 10 seconds to 15 minutes, more preferably about 15 seconds to one minute. The pre-exposure bake temperature may vary depending on the glass transition temperature of the resist.

The TARC composition of the invention is preferably applied directly over the resist layer by spin-coating. Any solvent in the TARC composition is then removed. The thickness of the TARC layer is typically on the order of 20-60 nm.

The resist layer is then patternwise-exposed to the desired radiation (e.g. 193 nm ultraviolet radiation). The patternwise exposure is conducted through a mask which is placed over the resist layer. For 193 nm UV radiation, the total exposure energy is preferably about 100 millijoules/cm$^2$ or less, more preferably about 50 millijoules/cm$^2$ or less (e.g. 15-30 millijoules/cm$^2$).

After the desired patternwise exposure, the resist layer is typically baked to further complete the acid-catalyzed reaction and to enhance the contrast of the exposed pattern. The post-exposure bake is preferably conducted at about 60-175° C., more preferably about 90-160° C. The post-exposure bake is preferably conducted for about 30 seconds to 5 minutes.

After post-exposure bake, if any, the resist structure with the desired pattern is obtained (developed) by contacting the resist layer with an aqueous alkaline solution which selectively dissolves the areas of the resist which were exposed to radiation in-the case of a positive resist (or the unexposed areas in the case of a negative resist). Preferred aqueous alkaline solutions (developers) are aqueous solutions of tetramethyl ammonium hydroxide. The resulting lithographic structure on the substrate is then typically dried to remove any remaining developer. The TARC of the invention is also dissolved by the developer in this step.

The pattern from the resist structure may then be transferred to the exposed portions of underlying material of the substrate by etching with a suitable etchant using techniques known in the art; preferably the transfer is done by reactive ion etching or by wet etching. Once the desired pattern transfer has taken place, any remaining resist may be removed using conventional stripping techniques. Alternatively, the pattern may be transferred by ion implantation to form a pattern of ion implanted material.

Examples of general lithographic processes where the composition of the invention may be useful are disclosed in U.S. Pat. Nos. 4,855,017; 5,362,663; 5,429,710; 5,562,801; 5,618,751; 5,744,376; 5,801,094; 5,821,469 and 5,948,570, the disclosures of which patents are incorporated herein by reference. Other examples of pattern transfer processes are described in Chapters 12 and 13 of "Semiconductor Lithography, Principles, Practices, and Materials" by Wayne Moreau, Plenum Press, (1988), the disclosure of which is incorporated herein by reference. It should be understood that the invention is not limited to any specific lithography technique or device structure.

The invention is further described by the examples below. The invention is not limited to the specific details of the examples.

EXAMPLE 1

Synthesis of Copolymer of 2-vinylnaphthalene and tert-butyl acrylate (PVNTBA1 (10/90))

0.77 g of 2-vinylnaphthalene, 5.77 g of tert-butyl acrylate and 0.41 g of 2,2'-azobis(2-methylpropionitrile) (AlBN) initiator were dissolved in 30 g of tetrahydrofuran (THF) and charged into a 3-neck flask. The system was then purged with N$_2$ for 30 minutes before the temperature was raised to 70° C. The reaction was carried out under N$_2$ overnight at 70° C. The solution was then precipitated in 1000 ml of deionized (DI) water. The precipitated solid was dissolved in ~35 g of acetone and re-precipitated in 1000 ml of DI water. The polymer was collected and dried in vacuum oven overnight at 65° C. Yield was 81% PVNTBA1 (10/90) having the structure illustrated below:

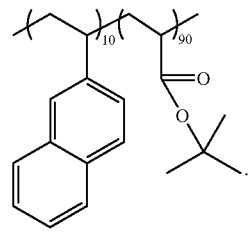

EXAMPLE 2

Synthesis of Copolymers of 2-vinylnaphthalene and tert-butyl acrylate (PVNTBA2(20/80)) and (PVNTBA3(40/60))

Two copolymers with different ratios of 2-vinylnaphthalene and tert-butyl acrylate were synthesized using the same procedure as described in Example 1 above except for the amount of the reactants added in the reaction mixtures. For synthesizing PVNTBA2(20/80): 1.54 g of 2-vinylnaphthalene, 5.13 g of tert-butyl acrylate and 0.41 g of AlBN initiator were dissolved in 30 g of THF; while for PVNTBA3(40/60): 3.08 g of 2-vinylnaphthalene, 3.85 g of tert-butyl acrylate and 0.41 g of AlBN initiator were dissolved in 30 g of THF. The yield for PVNTBA2(20/80) was 84%, while PVNTBA3(40/60) was 65%. The structures of these polymers are illustrated below:

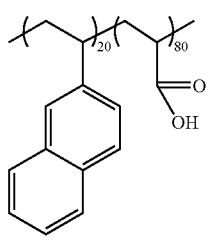

PVNTBA2(20/80)

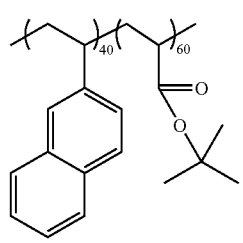

PVNTBA3(40/60)

EXAMPLE 3

Optical Properties of Copolymers of
2-vinylnaphthalene and tert-butyl acrylate

Each of the polymers synthesized in Examples 1 and 2 was dissolved in propylene glycol monomethyl ether acetate (PG-MEA) to obtain 5 wt. % of solids in solution. Each formulated solution was spin-coated on a silicon wafer and then baked on a hot plate at 110° C. for 60 seconds. Then n and k values were measured with VB-250 VASE Ellipsometer manufactured by J.A. Woollam Co. Inc. The measured optical properties of the film for 193 nm radiation are shown in the following table.

| Sample | Polymer Composition | n at 193 nm | k at 193 nm |
|---|---|---|---|
| 1 | PVNTBA1(10/90) | 1.570 | 0.022 |
| 2 | PVNTBA2(20/80) | 1.533 | 0.047 |
| 3 | PVNTBA3(40/60) | 1.391 | 0.132 |

EXAMPLE 4

Synthesis of Terpolymer of 2-vinylnaphthalene,
2-(trifluoromethyl)acrylic acid and
2-sulfoethylmethacrylate (PVNTFASM(45/40/15))

To a round bottom flask equipped with condenser, thermometer, a inlet and a magnetic stirrer bar, the following were added: 2-thalene monomer (1.237 g, 0.00803 mole), 2-(trifluoromethyl)acrylic acid monomer (1.0 g, 0.00719 moles), 2-sulfoethylmethacrylate (0.519 g, 0.002678 moles), AIBN (0.176 g, 6% of total moles of monomers), 1-dodecanethiol (0.108 g, 3% of total moles of monomers), and ~10 g of THF. The reaction mixture was stirred at room temperature and bubbled with Ar flow for 45 minutes prior to turning the heating mantle on. The reaction was carried out overnight at 70° C. under an inert argon atmosphere. Then the reaction solution was cooled to room temperature and precipitated in hexane. The solid was collected and dried in vacuum oven at 60° C. overnight. Yield was 89%. This polymer was spin-coated from a 4-methyl-2-pentanol solution and baked on a hot plate at 90° C. for 60 seconds. The resulting film exhibited an n value of 1.377 and a k value of 0.155. The structure of the polymer is illustrated below:

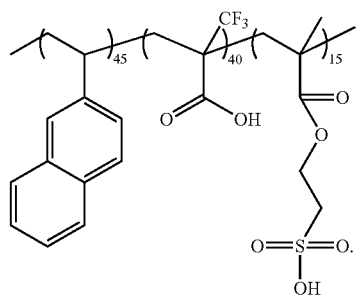

PVNTFASM(45/40/15)

EXAMPLE 5

Some Other Polymers Synthesized with n Value
Below 1.5

Several selected polymers combining different amount of various monomers were synthesized with the method either described in Example 1 or Example 4, then were measured with the method described in Example 3. They exhibited optical properties with n value of <1.5 as shown below:

TARC-P1

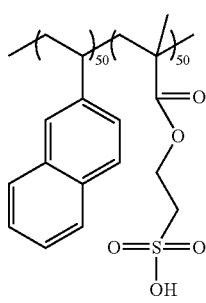

n = 1.483, k = 0.119

TARC-P2

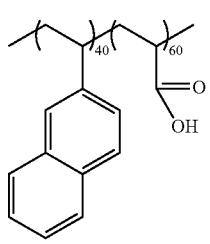

n = 1.374, k = 0.171

-continued

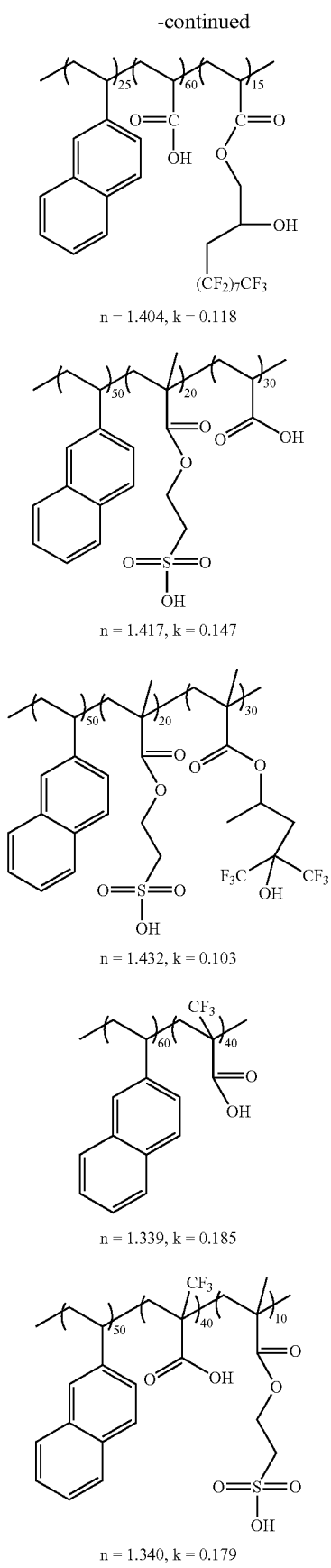

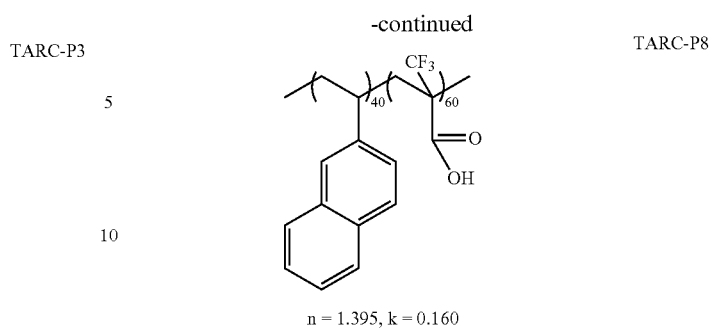

TARC-P3

TARC-P4

TARC-P5

TARC-P6

TARC-P7

TARC-P8 n = 1.395, k = 0.160

EXAMPLE 6

Effect of Acidic Moieties to Resist Image Profiles

One commercial 193 nm resist, AR1570J from JSR company was spin-coated on top of three 300 mm silicon wafers containing AR40 and baked at 130° C. for 60 s. The resist films obtained were about 240 nm thick. Two 1.1 wt. % TARC solutions were prepared by dissolving TARC-P3 and TARC-P5 polymers synthesized in Example 5 above in 1-butanol. Each solution was then spun on top of one resist coated wafer and baked on hot plate at 90° C. for 60 s. One wafer was left without any TARC as a control. The TARC films on the two coated wafers were about 30 nm thick. Lithographic exposures were performed on an ASML PAS 5500/1200 193 nm lithography tool with an NA of 0.75 using an attenuated phase shift mask (attPSM). After exposure, the resist was baked at 125° C. for 90 s before being developed with 0.263 N TMAH for 60 s. SEM pictures showed some skin on the resist images of the TARC-P3 wafer. The resist images of the TARC-P5 wafer are more rounded top in comparison to those of the control wafer. The linewidth of the resist images of TARC-P5 was 91.48 nm in comparison to 77.01 nm of the control for the targeted 80 nm lines in a slightly relaxed 245 nm pitch pattern (118L245P on Cr) printed at the same dose.

EXAMPLE 7

Swing Reduction Evaluation

PVNTFASM(45/40/15) polymer synthesized in Example 4 was dissolved in 4-methyl-2-pentanol to give 1.2 wt. % solids content. The solution was then spin coated on top of a resist and baked on hot plate at 90° C. for 60 s as a TARC to reduce critical dimension (CD) swing. The CD swing curve was obtained on an experimental 193 nm resist spin coated on top of HMDS primed Si wafer without TARC. A swing amplitude of >50% was observed. The CD swing curve was then generated on the same resist in the same thickness range (150 nm-240 nm) using 27 nm thick of PVNFASM(45/40/15) polymer film as TARC on top of the resist. A swing amplitude of <8% was obtained. This reduction in swing amplitude is an indication of the significant antireflection performance provided by the compositions of the invention.

What is claimed is:

1. A composition suitable for use as a top antireflective coating layer for 193 nm lithography, said composition consisting essentially of (i) an aqueous base-soluble polymer having aromatic moieties and sulfur-containing acidic moieties, a weight average molecular weight of at least about 1000, and a refractive index value n of less than 1.5 with respect to a radiation wavelength of 193 nm, and (ii) a solvent.

2. The composition of claim 1 wherein said aromatic moieties are selected from the group consisting of substituted or unsubstituted aromatic moieties or combinations thereof.

3. The composition of claim 2 wherein said aromatic moieties are independently selected from the group consisting of fused aromatic moieties, heterocyclic aromatic moieties and combinations thereof in substituted or unsubstituted form.

4. The composition of claim 3 wherein said aromatic moieties are selected from the group consisting of naphthalene, thiophene and combinations thereof.

5. The composition of claim 1 wherein said polymer further comprises moieties that promote the solubility of the composition in aqueous base solutions.

6. The composition of claim 5 wherein said solubility promoting moieties are selected from the group consisting of hydroxyl groups, sulfonamidyl groups, N-hydroxy dicarboxyimidyl groups, other dicarboxyimidyl groups, other amino groups and other imidyl groups.

7. The composition of claim 1 wherein said polymer further comprises fluorine-containing moieties.

8. The composition of claim 7 wherein said polymer includes at least one monomeric unit having a structure from the group consisting of:

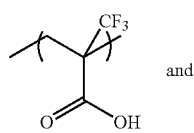
and

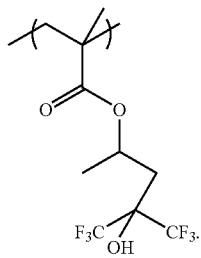

9. The composition of claim 1 wherein said polymer has an ethylenic backbone.

10. The composition of claim 9 wherein said polymer comprises monomeric units selected from the group consisting of vinyl, acrylates and methacryates and combinations thereof.

11. The composition of claim 9 wherein said aromatic moieties are pendant from said ethylenic backbone.

12. The composition of claim 1 wherein said refractive index n is about 1.4 or less.

13. The composition of claim 1 wherein said composition has an extinction coefficient k of about 0.05 to 0.25 with respect to a radiation wavelength of 193 nm.

14. The composition of claim 1 wherein said polymer includes at least one monomeric unit having a structure selected from the group consisting of:

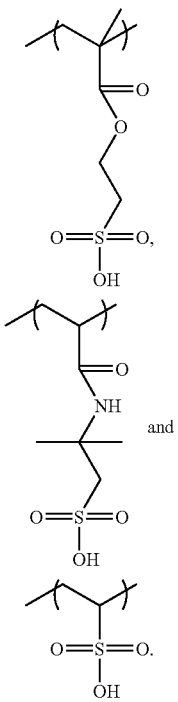

15. The composition of claim 1 wherein said polymer contains the following monomeric units:

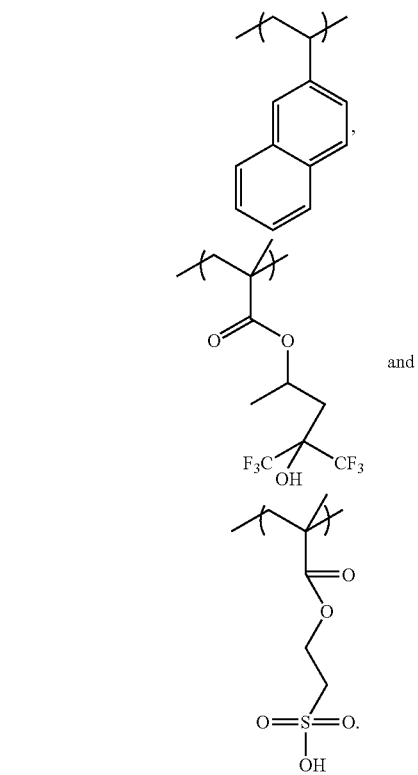

16. The composition of claim 15 wherein said polymer contains essentially of the following monomeric units:

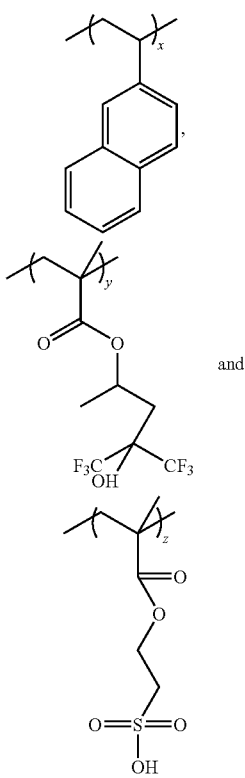

where x is about 35-65, y is about 20-65 and z is about 5-30.

17. The composition of claim 1 wherein said polymer contains the following monomeric units:

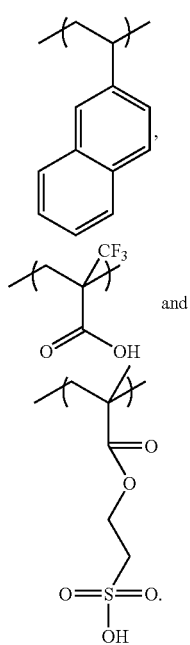

18. The composition of claim 17 wherein said polymer consists essentially of the following monomeric units:

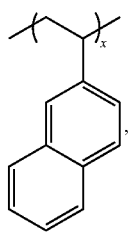

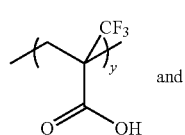

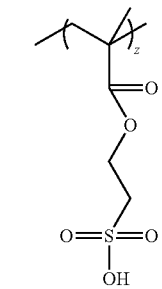

wherein x is about 25-60, y is about 30-70 and z is about 5-25.

19. The composition of claim 1 wherein said polymer has a weight average molecular weight of about 1500-50000.

20. A composition suitable for use as a top antireflective coating layer for 193 nm lithography, said composition comprising an aqueous base-soluble polymer having aromatic moieties and a refractive index value n of less than 1.5 with respect to a radiation wavelength of 193 nm said polymer further including sulfur-containing acidic moieties and fluorine-containing moieties.

* * * * *